(12) United States Patent
Hu et al.

(10) Patent No.: US 11,011,677 B2
(45) Date of Patent: May 18, 2021

(54) DISPLAY DEVICE

(71) Applicant: InnoLux Corporation, Miao-Li County (TW)

(72) Inventors: Shun-Yuan Hu, Miao-Li County (TW); Tsau-Hua Hsieh, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/252,917

(22) Filed: Jan. 21, 2019

(65) Prior Publication Data

US 2019/0280157 A1 Sep. 12, 2019

Related U.S. Application Data

(60) Provisional application No. 62/641,972, filed on Mar. 12, 2018, provisional application No. 62/640,675, filed on Mar. 9, 2018.

(30) Foreign Application Priority Data

Jul. 18, 2018 (CN) .......................... 201810791786.1

(51) Int. Cl.
*H01L 33/14* (2010.01)
*H01L 25/075* (2006.01)
(Continued)

(52) U.S. Cl.
CPC .......... *H01L 33/14* (2013.01); *H01L 25/0753* (2013.01); *H01L 33/0062* (2013.01);
(Continued)

(58) Field of Classification Search
CPC ......... H01L 33/14–145; H01L 33/0033–0037; H01L 33/483–486; H01L 2933/0033;
(Continued)

(56) References Cited

U.S. PATENT DOCUMENTS

| 2012/0025218 | A1* | 2/2012 | Ito .......................... H01L 33/505 257/88 |
| 2012/0032212 | A1 | 2/2012 | Huang et al. |
| 2015/0349200 | A1 | 12/2015 | Chen et al. |

FOREIGN PATENT DOCUMENTS

| CN | 104409584 A | 3/2015 |
| EP | 2 262 011 A2 | 12/2010 |
| WO | 2017/171812 A1 | 10/2017 |

OTHER PUBLICATIONS

European Search Report dated Jun. 13, 2019, issued in application No. EP 19161405.6.

(Continued)

*Primary Examiner* — Tucker J Wright
(74) *Attorney, Agent, or Firm* — McClure, Qualey & Rodack, LLP

(57) ABSTRACT

A display device is provided. The display device includes a substrate and a light-emitting unit disposed on the substrate. The light-emitting unit includes a transporting layer having a first semiconductor region and a second semiconductor region, and a conductive layer having a contact region that is in contact with the second semiconductor region. The distance between an edge of the contact region and an edge of the transporting layer is greater than or equal to 0.1 μm.

16 Claims, 6 Drawing Sheets

(51) Int. Cl.
    *H01L 33/00*          (2010.01)
    *H01L 33/06*          (2010.01)
    *H01L 33/30*          (2010.01)
    *H01L 33/32*          (2010.01)
    *H01L 33/38*          (2010.01)
    *H01L 33/42*          (2010.01)
    *H01L 33/44*          (2010.01)
    *H01L 33/46*          (2010.01)

(52) U.S. Cl.
    CPC .......... *H01L 33/0075* (2013.01); *H01L 33/06* (2013.01); *H01L 33/145* (2013.01); *H01L 33/30* (2013.01); *H01L 33/32* (2013.01); *H01L 33/38* (2013.01); *H01L 33/42* (2013.01); *H01L 33/44* (2013.01); *H01L 33/46* (2013.01); *H01L 2933/0016* (2013.01); *H01L 2933/0025* (2013.01)

(58) Field of Classification Search
    CPC ............. H01L 2933/0025; H01L 33/44; H01L 33/58–60; H01L 2933/0058
    See application file for complete search history.

(56) References Cited

OTHER PUBLICATIONS

Chinese language office action dated Sep. 11, 2020, issued in application No. CN 201810791786.1.

\* cited by examiner

DISPLAY DEVICE

CROSS REFERENCE TO RELATED APPLICATIONS

This application claims priority of U.S. Provisional Patent Application No. 62/640,675, filed on Mar. 9, 2018, U.S. Provisional Patent Application No. 62/641,972, filed on Mar. 12, 2018, and Chinese Patent Application No. 201810791786.1, filed on Jul. 18, 2018, the entirety of which are incorporated by reference herein.

BACKGROUND

Technical Field

The present disclosure relates to a display device and a method for manufacturing the display device.

Description of the Related Art

Electronic products that come with a display panel, such as smartphones, tablets, notebooks, monitors, and TVs, have become indispensable necessities in modern society. With the flourishing development of such portable electronic products, consumers have high expectations regarding the quality, functionality, and price of such products.

Gallium nitride (GaN)-based light-emitting diodes (LEDs) are expected to be used in the high-efficiency lighting devices of the future to replace incandescent and fluorescent lamps. GaN-based LED devices are generally formed on a substrate material by using a heteroepitaxial growth technique. A typical wafer-level LED device structure may comprise a single quantum well (SQW) or a multiple quantum well (MQW), an n-doped GaN layer and a p-doped GaN layer formed on a sapphire substrate.

Generally, a large (e.g., larger than 200 µm) light-emitting diode may have a transparent conductive layer and a current blocking layer disposed below the transparent conductive layer, so that current can diffuse more uniformly to the light-emitting area of the light-emitting diode. The problem of reduced luminous efficiency due to the current crowding effect can also be avoided. However, for smaller light-emitting diodes (such as a mini LED or micro LED), problems with uneven current spreading may arise due to the short path of current conduction, but current is easily conducted through the sidewalls of the light-emitting diode. In addition, since the sidewalls of the light-emitting diode usually have some defects and dangling bonds, the electrons that pass through the sidewalls are easily captured. Therefore, current leakage or the decrease of current flow through the light-emitting layer may occur, reducing the luminous efficiency.

Accordingly, the development of a structural design that can improve the luminous efficiency of a display device is one of the goals of the industry.

SUMMARY

In accordance with some embodiments of the present disclosure, a display device is provided. The display device comprises a substrate and a light-emitting unit disposed on the substrate. The light-emitting unit comprises a transporting layer comprising a first semiconductor region and a second semiconductor region, and a conductive layer comprising a contact region that is in contact with the second semiconductor region. The distance between an edge of the contact region and an edge of the transporting layer is greater than or equal to 0.1 µm.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
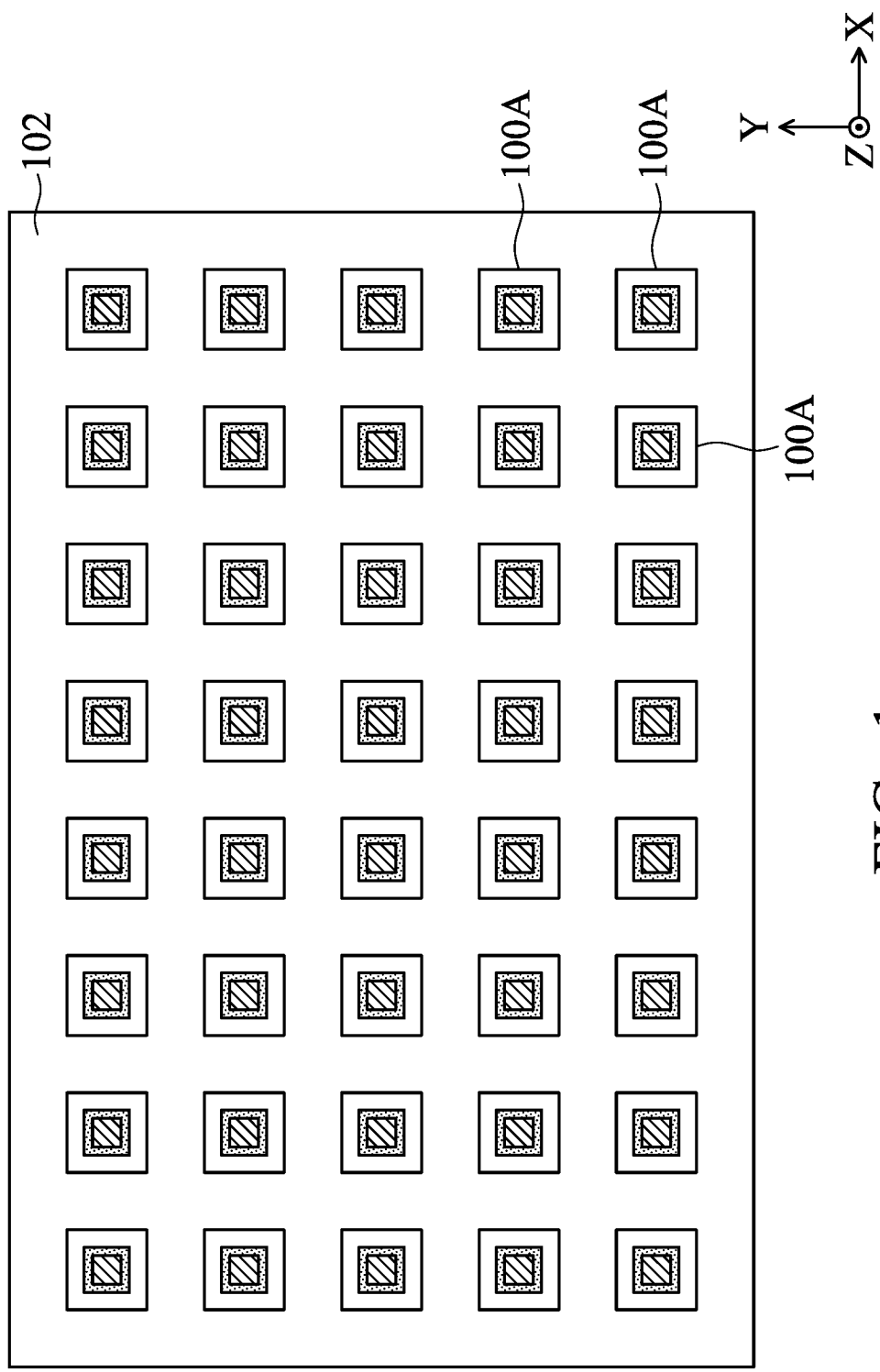
FIG. 1 illustrates a top-view diagram of the display device in accordance with some embodiments of the present disclosure.

The display device of the present disclosure and the manufacturing method thereof are described in detail in the following description. In the following detailed description, for purposes of explanation, numerous specific details and embodiments are set forth in order to provide a thorough understanding of the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements. However, the use of like and/or corresponding numerals in the drawings of different embodiments does not suggest any correlation between different embodiments. In addition, in this specification, expressions such as "first material layer disposed above/on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

In addition, in this specification, relative expressions are used. For example, "bottom" or "top" is used to describe the position of one element relative to another. It should be appreciated that if a device is flipped upside down, an element that is "bottom" will become an element that is "top". It should be understood that this description of the exemplary embodiments is intended to be read in connection with the accompanying drawings, which are to be considered part of the entire written description. Furthermore, spatially relative terms, such as "on," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The drawings are not drawn to scale. In addition, structures and devices are shown schematically in order to simplify the drawing.

It should be understood that, although the terms first, second, third etc. may be used herein to describe various elements, components, regions, layers, portions and/or sections, these elements, components, regions, layers, portions and/or sections should not be limited by these terms. These terms are used to distinguish one element, component, region, layer, portion or section from another element, component, region, layer or section.

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value comprises the meaning of "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

In accordance with some embodiments of the present disclosure, a distance exists between the edge of the conductive layer and the edge of the transporting layer so that the chance of current flowing through the sidewall edges of the light-emitting unit may be reduced. Therefore, the risk of current leakage may be reduced, and the luminous efficiency of the light-emitting unit may be improved. In accordance with some embodiments of the present disclosure, the light-emitting unit of the display device may comprise a current blocking layer disposed on the side surfaces, which may further prevent the defect of the side surfaces from capturing electrons and causing leakage current. Such a configuration may also reduce the risk of short circuit when the display device is in contact with other conductive elements during an assembling process.

FIG. 1 illustrates a top-view diagram of a display device 10 in accordance with some embodiments of the present disclosure, i.e. the top-view diagram of the display device 10 corresponding to X-Y plane in FIG. 1. As shown in FIG. 1, the display device 10 may comprise a substrate 102 and a plurality of light-emitting units 100A disposed on the substrate 102. In some embodiments, the substrate 102 may serve as a driving substrate of the display device 10. Specifically, the substrate 102 may further comprise a driving circuit (not illustrated), for example, a switch for controlling the light-emitting unit 100A. The driving circuit may be an active driving circuit or a passive driving circuit. For example, the driving circuit may comprise a thin-film transistor (TFT) in accordance with some embodiments. In some other embodiments, the driving circuit may be controlled by an exterior integrated circuit (IC) or microchip. In addition, Z direction is substantially the normal direction of the substrate 102 in accordance with some embodiments.

In some embodiments, the substrate 102 may comprise, but is not limited to, glass, quartz, sapphire, polycarbonate (PC), polyimide (PI), polyethylene terephthalate (PET), rubbers, glass fibers, other suitable materials, or a combination thereof. In some embodiments, the substrate 102 may be made of a metal-glass fiber composite plate, a metal-ceramic composite plate, a printed circuit board and so on.

It should be understood that the display device 10 may further comprise a wavelength conversion layer, a color filter, or a light-shielding layer etc. disposed over the light-emitting unit 100A. One with ordinary skill in the art may have suitable structures be disposed in the display device 10 according to needs.

Figure 2:
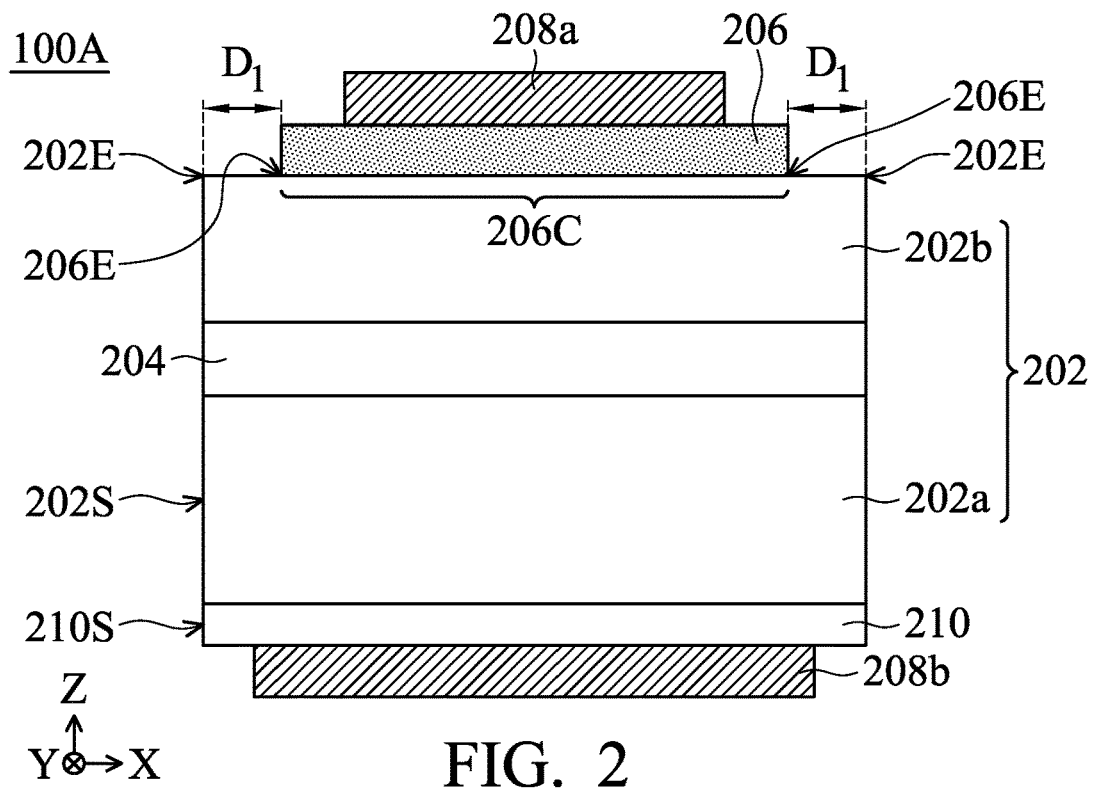
FIG. 2 illustrates a cross-sectional diagram of the light-emitting unit in accordance with some embodiments of the present disclosure.

Next, refer to FIG. 2, which illustrates a cross-sectional diagram of the light-emitting unit 100A in accordance with some embodiments of the present disclosure, i.e. the cross-sectional diagram of the light-emitting unit 100A corresponding to the X-Z plane in FIG. 2. In this embodiment, the light-emitting unit 100A is a vertical type light-emitting unit. As shown in FIG. 2, the light-emitting unit 100A may comprise a transporting layer 202 (a first semiconductor region 202a and a second semiconductor region 202b), a quantum well layer 204 disposed in the transporting layers 202 (between the first semiconductor region 202a and the second semiconductor region 202b), and a first conductive layer 206 disposed on the transporting layer 202. The transporting layer 202 may be used to transmit electrons or electron holes in the light-emitting unit 100A, and the electrons and electron holes may combine in the quantum well layer 204 to emit light. In addition, in some embodiments, the light-emitting unit 100A may comprise a LED, a micro LED or an organic light-emitting diode (OLED). In some embodiments, the light-emitting unit 100A may have a size (length×width×height) of about 1 μm×1 μm×1 μm to about 200 μm×200 μm×200 μm, or about 1 μm×1 μm×1 μm to about 150 μm×150 μm×150 μm. More specifically, in some embodiments, the die of the light-emitting unit 100A may have a size of about 1 μm×1 μm×1 μm to about 200 μm×200 μm×200 μm, or about 1 μm×1 μm×1 μm to about 150 μm×150 μm×150 μm.

Moreover, the transporting layer 202 may comprise a first semiconductor region 202a and a second semiconductor region 202b. The first semiconductor region 202a and the second semiconductor region 202b may be used to respectively provide and transmit electrons and electron holes. In some embodiments, the first semiconductor region 202a and the second semiconductor region 202b may be formed of semiconductor materials having n-type conductivity and the semiconductor materials having p-type conductivity, respectively. However, in some other embodiments, the first semiconductor region 202a and the second semiconductor region 202b may be formed of semiconductor materials having p-type conductivity and the semiconductor materials having n-type conductivity, respectively. The semiconductor materials having n-type conductivity may comprise gallium nitride (n-GaN) or aluminum indium phosphide (n-AlInP) that is doped with tetravalent atoms. The semiconductor materials having p-type conductivity may comprise gallium nitride (p-GaN) or aluminum indium phosphide (p-AlInP) that is doped with divalent atoms. In addition, the quantum well layer 204 may comprise a single quantum well (SQW) or a multiple quantum well (MQW). The material of the quantum well layer 204 may comprise, but is not limited to, gallium nitride, aluminum indium phosphide (AlInP), indium gallium nitride (InGaN), or a combination thereof.

In some embodiments, the first semiconductor region 202a, the second semiconductor region 202b and the quantum well layer 204 may be formed by an epitaxial growth process. The epitaxial growth process may comprise molecular beam epitaxy (MBE) process, liquid phase epitaxy (LPE) process, solid phase epitaxy (SPE) process, vapor phase epitaxy (VPE) process, selective epitaxial growth (SEG) process, metal organic chemical vapor deposition (MOCVD) process, atomic layer deposition (ALD) process, or a combination thereof.

As described above, the first conductive layer 206 may be disposed on the transporting layer 202. In some embodiments, the first conductive layer 206 may be used to assist the spreading of current to the underlying transporting layer 202. In some embodiments, the first conductive layer 206 comprises a contact region 206C that is in contact with the second semiconductor region 202b. In some embodiments, the contact region 206C may also be regarded as a boundary region between the first conductive layer 206 and the second semiconductor region 202b. As shown in FIG. 2, in some embodiments, an edge 206E of the contact region 206C is separated from an edge 202E of the transporting layer 202 by a distance $D_1$. In other words, in some embodiments, the edge 202E of the transporting layer 202 may not be aligned with the edge 206E of the first conductive layer 206. In some embodiments, the distance $D_1$ between the edge 206E of the contact region 206C and the edge 202E of the transporting layer 202 (the second semiconductor region 202b) is greater than or equal to 0.1 μm in a direction that is perpendicular to Z direction (i.e. in the X-Y plane). In some embodiments, the distance $D_1$ is greater than or equal to 0.5 μm. It should be understood that the first conductive layer 206 may have a smaller size as long as current may flow through the first conductive layer 206. Therefore the maximum value of the distance D1 may be different in various embodiments.

In some embodiments, the first conductive layer 206 described above may be formed of a transparent conductive material. In some embodiments, the transparent conductive material may comprise a transparent conductive oxide (TCO). For example, the transparent conductive oxide may comprise, but is not limited to, indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO), other suitable transparent conductive materials or a combination thereof.

In some embodiments, the first conductive layer 206 may be formed by using one or more deposition processes, photolithography processes and etching process. In some embodiments, the deposition process may comprise a chemical vapor deposition process, a physical vapor deposition process, an electroplating process, an electroless plating process, another suitable process, or a combination thereof. For example, examples of the chemical vapor deposition process comprise a low-pressure chemical vapor deposition (LPCVD) process, a low-temperature chemical vapor deposition (LTCVD) process, a rapid thermal chemical vapor deposition (RTCVD) process, a plasma enhanced chemical vapor deposition (PECVD) process, an atomic layer deposition (ALD) process, and so on. For example, the physical vapor deposition process may comprise a sputtering process, an evaporation process, pulsed laser deposition, and so on. In addition, in some embodiments, the photolithography process may comprise photoresist coating (e.g., spin coating), soft baking, hard baking, mask aligning, exposure, post-exposure baking, developing the photoresist, rinsing, drying, or another suitable process. In some embodiments, the etching process may comprise a dry etching process, a wet etching process, or another suitable etching process.

As described above, the edge 206E of the contact region 206C is separated from the edge 202E of the transporting layer 202 (the second semiconductor region 202b) by the distance $D_1$. In other words, the first conductive layer 206 shrinks inward (retracts) whereas the transporting layer 202 does not. Thus, a width of the first conductive layer 206 along X-direction is less than a width of the transporting layer 202 along X-direction. With such a configuration, the first conductive layer 206 may direct current from the contact region 206C to the second semiconductor region 202b that is below the contact region 206C. The chance that current flows through the sidewalls of the transporting layer 202 and to be trapped by defects on the sidewalls may be reduced. Accordingly, the risk that leakage current will occur may be reduced and the luminous efficiency of the light-emitting unit 100A may be improved.

In addition, in some embodiments, the light-emitting unit 100A may further comprise a second conductive layer 208a and a third conductive layer 208b disposed on both sides of the transporting layer 202, and the second conductive layer 208a may be disposed on the first conductive layer 206. The second conductive layer 208a and the third conductive layer 208b may serve as electrodes of the light-emitting unit 100A, and may be further coupled to the signal lines and the driving circuits to control the switch of the light-emitting unit 100A. It should be understood that although the second conductive layer 208a is smaller than the first conductive layer 206, the second conductive layer 208a may be any suitable size in other embodiments. Similarly, the third conductive layer 208b may also be any suitable size.

In some embodiments, the second conductive layer 208a and the third conductive layer 208b may be formed of metallic conductive materials. For example, the metallic conductive material may comprise, but is not limited to, copper (Cu), aluminum (Al), tungsten (W), titanium (Ti), gold (Au), platinum (Pt), nickel (Ni), copper alloy, aluminum alloy, tungsten alloy, titanium alloy, gold alloy, platinum alloy, nickel alloy, other suitable conductive materials, or a combination thereof.

In some embodiments, the second conductive layer 208a and the third conductive layer 208b may be formed by using one or more deposition processes, photolithography processes and etching process. In some embodiments, the deposition process may comprise a chemical vapor deposition process as described above, a physical vapor deposition process as described above, an electroplating process, an electroless plating process, another suitable process, or a combination thereof. In addition, in some embodiments, the photolithography process may comprise photoresist coating (e.g., spin coating), soft baking, hard baking, mask aligning, exposure, post-exposure baking, developing the photoresist, rinsing, drying, or another suitable process. In some embodiments, the etching process may comprise a dry etching process, a wet etching process, or another suitable etching process.

Figure 6:
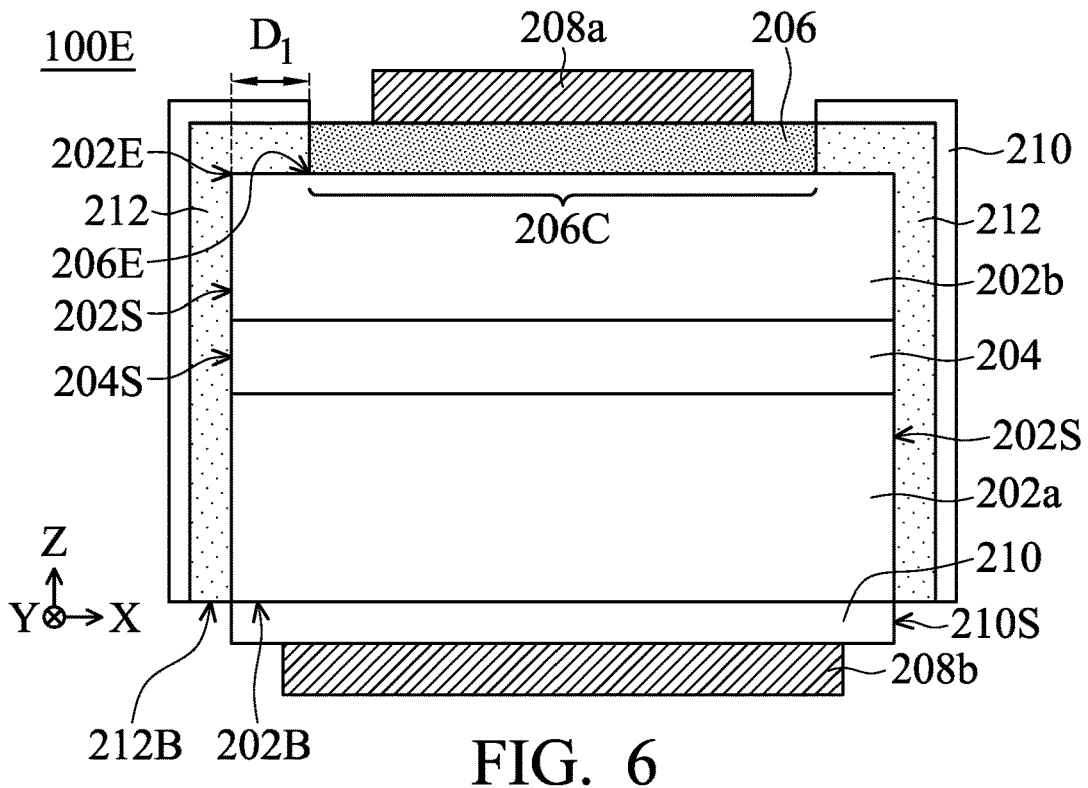
FIG. 6 illustrates a cross-sectional diagram of the light-emitting unit in accordance with some embodiments of the present disclosure.

In addition, in some embodiments, the light-emitting unit 100A may further comprise a reflective layer 210 disposed between the transporting layer 202 and the third conductive layer 208b. The reflective layer 210 may prevent light leakage to increase the light extraction efficiency of the light-emitting unit 100A. In some embodiments, as shown in FIG. 2, a side surface 210S of the reflective layer 210 may be substantially aligned with a side surface 202S of the transporting layer 202. However, in some other embodiments, the side surface 210S of the reflective layer 210 may be not aligned with the side surface 202S of the transporting layer 202 (as shown in FIG. 6).

The reflective layer 210 may be formed of materials having reflective properties. In some embodiments, the material of the reflective layer 210 may comprise metals. For example, the material of the reflective layer 210 may comprise, but it is not limited to, copper (Cu), aluminum (Al), indium (In), ruthenium (Ru), tin (Sn), gold (Au), platinum (Pt), zinc (Zn), silver (Ag), titanium (Ti), lead (Pb), nickel (Ni), chromium (Cr), magnesium (Mg), palladium (Pd), other suitable materials or a combination thereof. In another embodiment, the material of the reflective layer 210 may also comprise $TiO_2$, $SiO_2$ or a combination thereof, or a combination of $SiO_2$, $TiO_2$ and metallic materials.

In some embodiments, the reflective layer 210 may be formed by using one or more deposition processes, photolithography processes and etching process. In some embodiments, the deposition process may comprise a chemical vapor deposition process as described above, a physical vapor deposition process, an electroplating process, an electroless plating process, another suitable process, or a combination thereof. For example, the physical vapor deposition process may comprise sputtering process, resistance heating evaporation process, electron beam evaporation process, pulsed laser deposition process and so on. In addition, in some embodiments, the photolithography process may comprise photoresist coating (e.g., spin coating), soft baking, hard baking, mask aligning, exposure, post-exposure baking, developing the photoresist, rinsing, drying, or another suitable process. In some embodiments, the etching process may comprise a dry etching process, a wet etching process, or another suitable etching process. In some embodiments, the reflective layer 210 may also be formed by a printing process or an inkjet printing (IJP) process.

Moreover, in accordance with some embodiments, the transporting layer 202, the first conductive layer 206, and the second conductive layer 208a may be sequentially formed on a temporary substrate (not illustrated). Then, the temporary substrate may be removed, and the reflective layer 210 and the third conductive layer 208b may be sequentially formed on the transporting layer 202 to complete the light-emitting unit 100A. In addition, it should be understood that additional operations can be provided before, during, and after the manufacturing process of the light-emitting unit in accordance with some embodiment. Some of the operations described can be replaced, interchanged or eliminated in accordance with some other embodiments.

Figure 3:
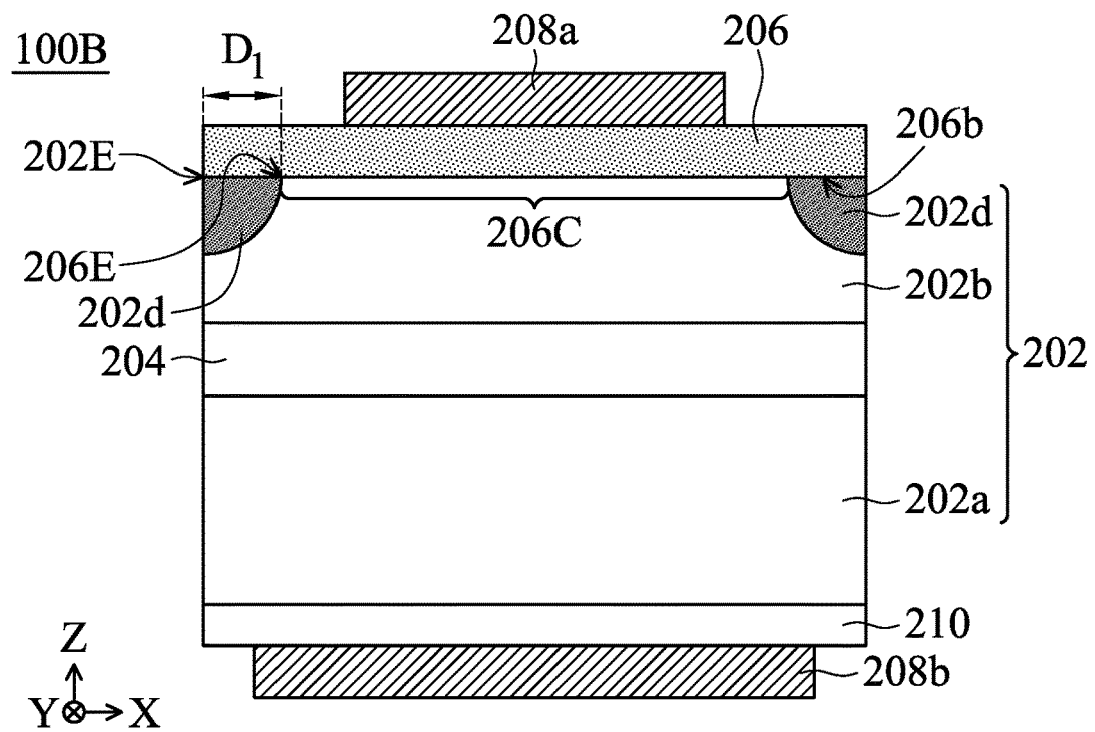
FIG. 3 illustrates a cross-sectional diagram of the light-emitting unit in accordance with some embodiments of the present disclosure.

Next, refer to FIG. 3, which illustrates a cross-sectional diagram of a light-emitting unit 100 in accordance with some other embodiments of the present disclosure. It should be understood that the same or similar components or elements in above and below contexts are represented by the same or similar reference numerals. The materials, manufacturing methods and functions of these elements or layers are the same or similar to those described above, and thus will not be repeated herein.

The light-emitting unit 100B shown in FIG. 3 is substantially similar to the light-emitting unit 100A shown in FIG. 2. The difference between them is that the transporting layer 202 may further comprise high-resistance regions 202d disposed on both sides of the second semiconductor region 202b and in contact with the second semiconductor region 202b in the embodiment shown in FIG. 3. In some other embodiments, the high-resistance region 202d can be disposed at least one side of the second semiconductor region 202b. In this embodiment, the high-resistance regions 202d and the first conductive layer 206 may partially overlap in the Z direction (the normal direction of the substrate 102). In this embodiment, the high-resistance region 202ds may extend from a bottom surface 206b of the first conductive layer 206 toward the quantum well layer 204. In some embodiments, the maximum distance that the high-resistance region 202d extends toward the quantum well layer 204 is about ¼ times to about 1 times the height of the second semiconductor region 202b, for example, about ½ times, ⅓ times 2, 3 times, ¼ times, or ¾ times the height of the second semiconductor region 202b. Moreover, in some embodiments, the high-resistance regions 202d may be electrically insulating. Thus, an ohmic resistance between the first conductive layer 206 and the transporting layer 202 may be increased to prevent current from diffusing outward to the sidewall of the transporting layer 202 (the second semiconductor region 202b). The reduction of luminous efficiency of the light-emitting unit 100B may also be avoided.

In some embodiments, the high-resistance regions 202d may comprise GaN or AlInP, and may be formed without doping divalent or tetravalent elements, or by doping with a concentration that is much lower than that of the second semiconductor region 202b (i.e. the dopant concentration of the high-resistance regions 202d is much lower than that of the second semiconductor region 202b). For example, the resistance of the high-resistance regions 202d may be more than five times the resistance of the second semiconductor region 202b. Alternatively, the carrier mobility of the second semiconductor region 202b may be more than five times the carrier mobility of the high-resistance regions 202d. In other embodiments, the high-resistance regions 202d may be doped with aluminum elements, as long as the resistance of the high-resistance regions 202d is higher than the second semiconductor region 202b, and the chance that current diffuses outward to the sidewalls of the transporting layer 202 (the second semiconductor region 202b) may be reduced. Thus, the reduction of luminous efficiency of the light-emitting unit 100 may be avoided.

In this embodiment, the first conductive layer 206 may also have a contact region 206C that is in contact with the second semiconductor region 202b, and the contact region 206C is located between the high-resistance regions 202d. Similarly, in this embodiment, the edge 206E of the contact region 206C is separated from the edge 202E of the transporting layer 202 by the distance $D_1$. In some embodiments, the distance $D_1$ between the edge 206E of the contact region 206C and the edge 202E of the transporting layer 202 may be greater than or equal to 0.1 µm. The distance $D_1$ between the edge 206E of the contact region 206C and the edge 202E of the transporting layer 202 is less than half a width of the first conductive layer 206 along X direction in accordance with some embodiments. In some embodiments, the distance $D_1$ may be greater than or equal to 0.5 µm. Moreover, as shown in FIG. 3, in this embodiment, the distance $D_1$ is substantially the same as the width of the high-resistance region 202d.

Figure 4:
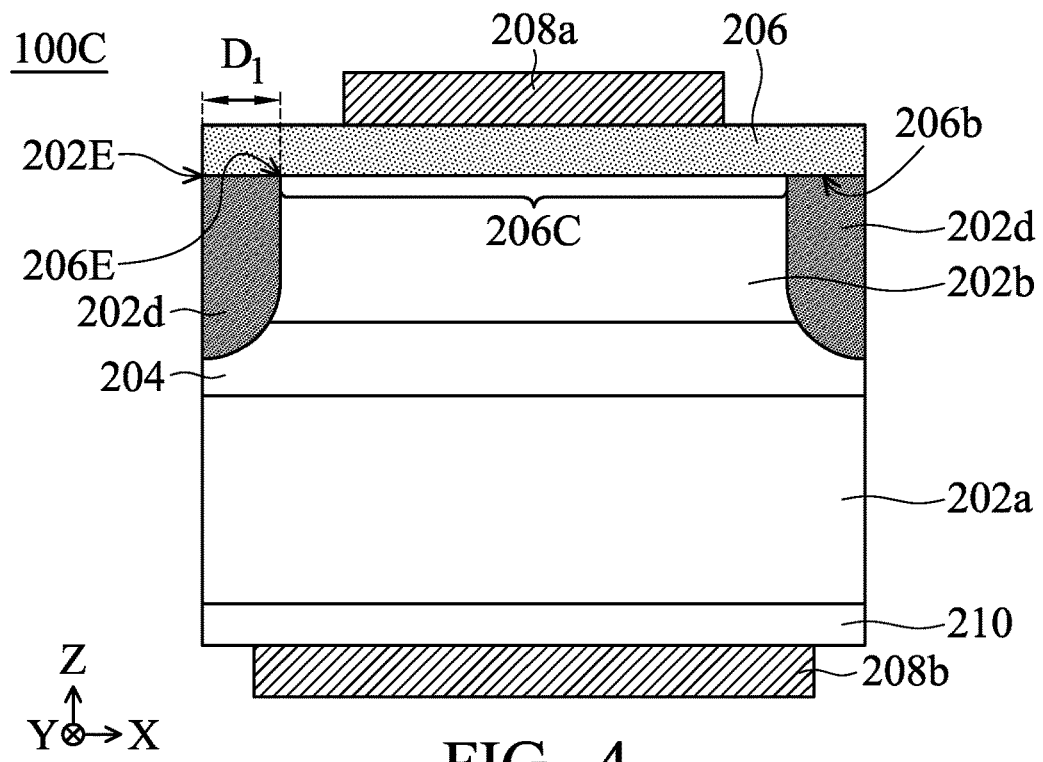
FIG. 4 illustrates a cross-sectional diagram of the light-emitting unit in accordance with some embodiments of the present disclosure.

Next, refer to FIG. 4, which illustrates a cross-sectional diagram of a light-emitting unit 100C in accordance with some other embodiments of the present disclosure. The light-emitting unit 100C shown in FIG. 4 is substantially similar to the light-emitting unit 100 shown in FIG. 3. The difference between them is that the high-resistance regions 202d further extend to the quantum well layer 204 in the embodiment shown in FIG. 4. Specifically, the high-resistance regions 202d extend from the bottom surface 206b of the first conductive layer 206 toward the quantum well layer 204, and the maximum heights of the high-resistance regions 202d are greater than the maximum height of the second semiconductor region 202b in the z direction. In this embodiment, the high-resistance regions 202d are in contact with the first conductive layer 206, the second semiconductor region 202b, and the quantum well layer 204. Moreover, in this embodiment, the high-resistance regions 202d may partially overlap the first conductive layer 206 and the quantum well layer 204 in the Z direction. In some embodiments, portions of the surfaces of the high-resistance regions 202d are in contact with the quantum well layer 204. As described above, the high-resistance regions 202d may be electrically insulating so current is not transmitted through the sidewalls of the transporting layer 202. On the contrary, most of the current is transmitted through the position corresponding to the contact region 206C, and therefore the luminous efficiency of the light-emitting unit 100C may be improved.

Figure 5:
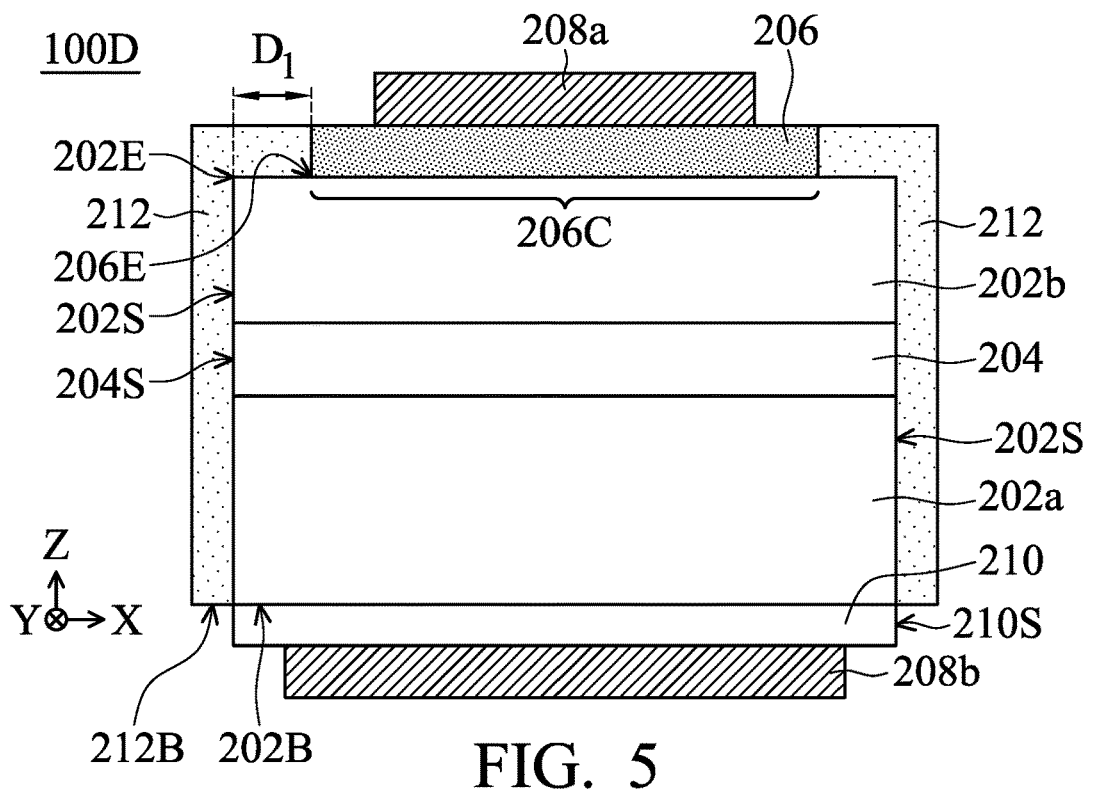
FIG. 5 illustrates a cross-sectional diagram of the light-emitting unit in accordance with some embodiments of the present disclosure.

Next, refer to FIG. 5, which illustrates a cross-sectional diagram of a light-emitting unit 100D in accordance with some other embodiments of the present disclosure. The light-emitting unit 100D shown in FIG. 5 is substantially similar to the light-emitting unit 100A shown in FIG. 2. The difference between them is that the light-emitting unit 100D further comprise current blocking layers 212 that cover the side surfaces 202S of the transporting layer 202. The side surface 202S of the transporting layer 202 may also be regarded as a side surface of the first semiconductor region 202a or a side surface of the second semiconductor region 202b. The current blocking layers 212 may reduce the probability of current flowing through the sidewalls of the transporting layer 202, and may reduce the occurrence of leakage current. In some embodiments, the current blocking layers 212 may also cover the side surfaces 204S of the quantum well layer 204. Moreover, in some embodiments, the first conductive layer 206 may be sandwiched between the current blocking layers 212. In some embodiments, the current blocking layers 212 and transporting layer 202 may partially overlap in the Z direction.

In addition, the bottom surface 212B of the current blocking layer 212 may be substantially aligned with the bottom surface 202B of the transporting layer 202 (the first semiconductor region 202a) in accordance with some embodiments. On the other hand, as shown in FIG. 5, the side surface 210S of the reflective layer 210 may be substantially aligned with the side surface 202S of the transporting layer 202 in accordance with some embodiments.

As shown in FIG. 5, the first conductive layer 206 may also have a contact region 206C that is in contact with the second semiconductor region 202b. Similarly, in this embodiment, the edge 206E of the contact region 206C is separated from the edge 202E of the transporting layer 202 by the distance $D_1$ in a direction that is perpendicular to Z direction (i.e. in the X-Y plane). In some embodiments, the distance $D_1$ between the edge 206E of the contact region 206C and the edge 202E of the transporting layer 202 may be greater than or equal to 0.1 µm. In some embodiments, the distance $D_1$ may be greater than or equal to 0.5 µm.

In addition, the current blocking layer 212 may be formed of insulating materials. In some embodiments, the insulating material may comprise, but is not limited to, silicon oxides (SiOx), silicon nitrides (SiNx), silicon oxynitrides (SiON), aluminum oxides ($Al_2O_3$), titanium dioxides ($TiO_2$), other suitable materials, or a combination thereof. In some embodiments, the current blocking layer 212 may be formed by using one or more deposition processes, photolithography processes and etching process. In some embodiments, the deposition process may comprise a chemical vapor deposition process as described above, a physical vapor deposition process, an electroplating process, an electroless plating process, another suitable process, or a combination thereof. In addition, in some embodiments, the photolithography process may comprise photoresist coating (e.g., spin coating), soft baking, hard baking, mask aligning, exposure, post-exposure baking, developing the photoresist, rinsing, drying, or another suitable process. In some embodiments, the etching process may comprise a dry etching process, a wet etching process, or another suitable etching process. In accordance with some embodiments, after the transporting layer 202, the first conductive layer 206, and the second conductive layer 208a are formed on the temporary substrate, the current blocking layer 212 is formed. Then, the temporary substrate is removed, and the reflective layer 210 and the third conductive layer 208b are sequentially formed on the bottom surface 202B of the transporting layer 202.

Furthermore, in some embodiments, when the second conductive layer 208a or the third conductive layer 208b of the light-emitting unit 100D is electrically connected to other conductive elements (e.g., the signal lines), the current blocking layer 212 may also prevent other conductive elements from contacting the transporting layer 202 and causing the risk of short circuit.

Next, refer to FIG. 6, which illustrates a cross-sectional diagram of a light-emitting unit 100E in accordance with some other embodiments of the present disclosure. The light-emitting unit 100E shown in FIG. 6 is substantially similar to the light-emitting unit 100D shown in FIG. 5. The difference between them is that the light-emitting unit 100E may further comprise the reflective layers 210 that cover the current blocking layers 212 in the embodiment shown in FIG. 6. The reflective layer 210 covering the current blocking layer 212 may increase the amount of light emission at front and reduce the amount of light emission at the sides of the light-emitting unit 100E. Therefore, crosstalk interference may be reduced and the luminous efficiency of the light-emitting unit 100E may be improved.

As described above, the reflective layers 210 may be formed of materials comprising reflective properties. In some embodiments, the material of the reflective layers 210 may comprise metals. For example, the material of the reflective layers 210 may comprise, but it is not limited to, copper (Cu), aluminum (Al), indium (In), ruthenium (Ru), tin (Sn), gold (Au), platinum (Pt), zinc (Zn), silver (Ag), titanium (Ti), lead (Pb), nickel (Ni), chromium (Cr), magnesium (Mg), palladium (Pd), other suitable materials or a combination thereof. In another embodiment, the material of the reflective layer 210 may also comprise $TiO_2$, $SiO_2$ or a combination thereof, or a combination of $SiO_2$, $TiO_2$ and metallic materials. In other embodiments, the reflective layer 210 may cover the sidewalls of the current blocking layer 212. The relative position of the reflective layer 210 and the current blocking layer 212 is not particularly limited in the present disclosure, as long as the reflective layer 210 may increase the amount of light emission at front and reduce the amount of light emission at the sides of the light-emitting unit 100E.

Figure 7:
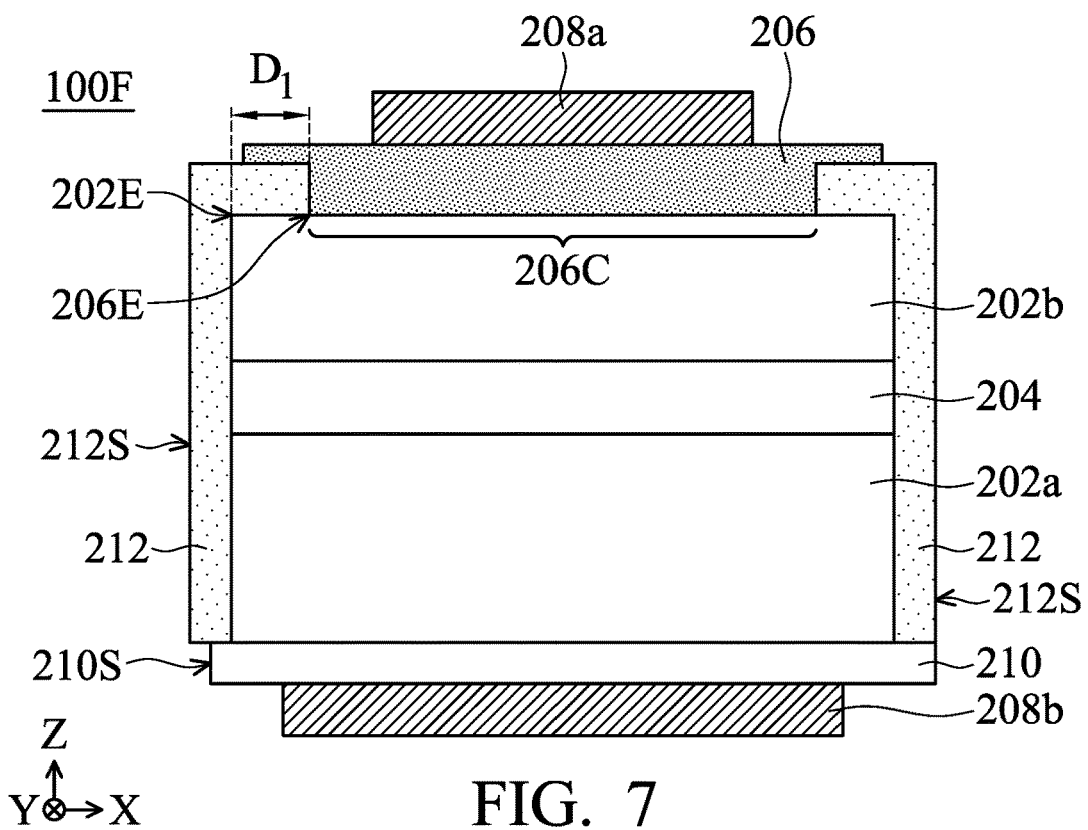
FIG. 7 illustrates a cross-sectional diagram of the light-emitting unit in accordance with some embodiments of the present disclosure.

Next, refer to FIG. 7, which illustrates a cross-sectional diagram of a light-emitting unit 100F in accordance with some other embodiments of the present disclosure. The light-emitting unit 100F shown in FIG. 7 is substantially similar to the light-emitting unit 100D shown in FIG. 5. The difference between them is that the first conductive layer 206 and the current blocking layer 212 at least partially overlap in the Z direction in the embodiment shown in FIG. 7. As shown in FIG. 7, in the light-emitting unit 100E, portions of the current blocking layers 212 may be disposed between the first conductive layer 206 and the second semiconductor region 202b. In other words, a portion of the first conductive layer 206 may overlay the current blocking layer 212. In addition, in some embodiments, as shown in FIG. 7, the side surface 210S of the reflective layer 210 may or may not be aligned with the side surface 212S of the current blocking layer 212.

In this embodiment, after the transporting layer 202 is formed on the temporary substrate, the current blocking layers 212 are formed to cover portions of the transporting layers 202, and then the first conductive layer 206 is formed on the transporting layer 202 and portions of the current blocking layers 212. In addition, the second conductive layer 208a is formed on the first conductive layer 206. Then, the temporary substrate is removed, and the reflective layer 210 and the third conductive layer 208b are sequentially formed.

Figure 8:
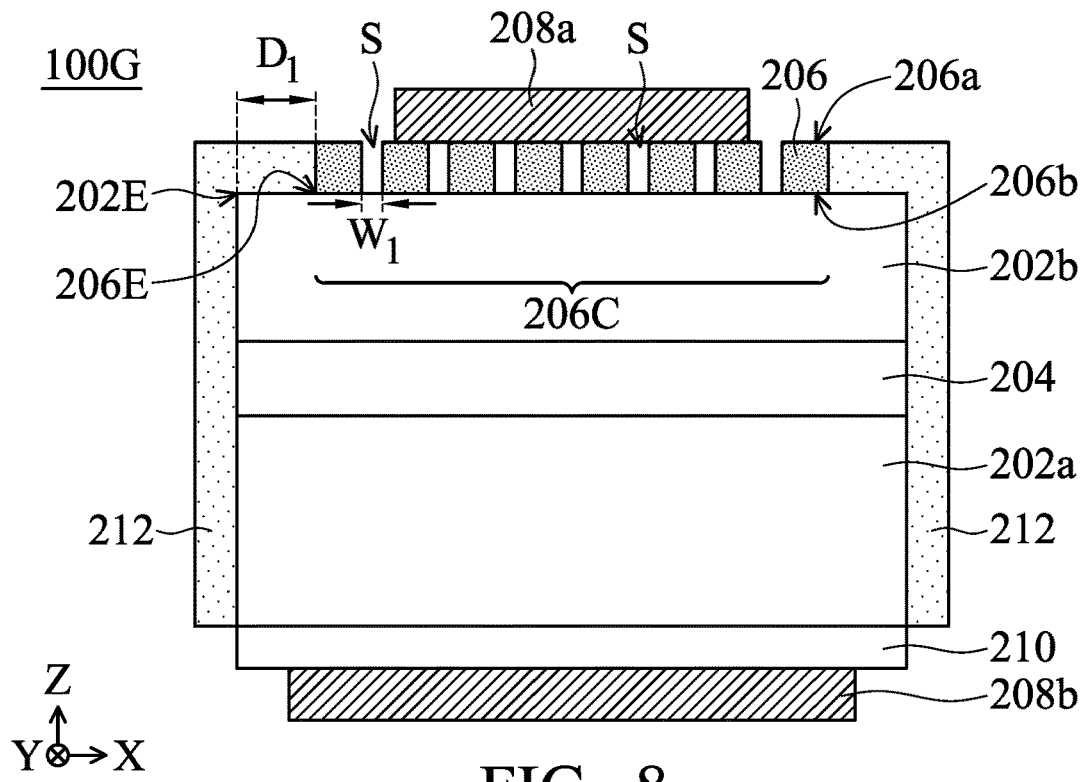
FIG. 8 illustrates a cross-sectional diagram of the light-emitting unit in accordance with some embodiments of the present disclosure.

Next, refer to FIG. 8, which illustrates a cross-sectional diagram of a light-emitting unit 100G in accordance with some other embodiments of the present disclosure. The difference between them is that the first conductive layer 206 of the light-emitting unit 100G further comprises a plurality of slits S. The slits S may extend from a top surface 206a of the first conductive layer 206 to the bottom surface 206b of the first conductive layer 206. The slits S may increase the amount of light emitted from the light-emitting unit 100F. In some embodiments, the first conductive layer 206 may have other patterns so that the light passing through the first conductive layer 206 may be increased. In some embodiments, the width $W_1$ of the slit S may be in a range from about 0.001 µm to about 50 µm, or from about 1 µm to about 25 µm. It should be noted that the shape of the slit is not limited to an elongated shape in this embodiment, and may be circular, elliptical or have an arc shape.

In this embodiment, the first conductive layer 206 may also have a contact region 206C that is in contact with the second semiconductor region 202b. Moreover, in this embodiment, the outermost edge 206E of the contact region 206C (i.e. the edge of the contact region 206C that is closest to the edge 202E of the transporting layer 202) is also separated from the edge 202E of the transporting layer 202 by the distance D1 in a direction that is perpendicular to Z direction (i.e. in the X-Y plane). In some embodiments, the distance D1 between the edge 206E of the contact region 206C and the edge 202E of the transporting layer 202 may be greater than or equal to 0.1 µm. In some embodiments, the distance D1 may be greater than or equal to 0.5 µm.

In some embodiments, the slits S may be formed in the first conductive layer 206 by a patterning process. In some embodiments, the patterning process may comprise a photolithography process and an etch process. The photolithography process may comprise photoresist coating (e.g., spin coating), soft baking, hard baking, mask aligning, exposure, post-exposure baking, developing the photoresist, rinsing, drying, and the like. The etching process may comprise a dry etching process or a wet etching process.

Figure 9:
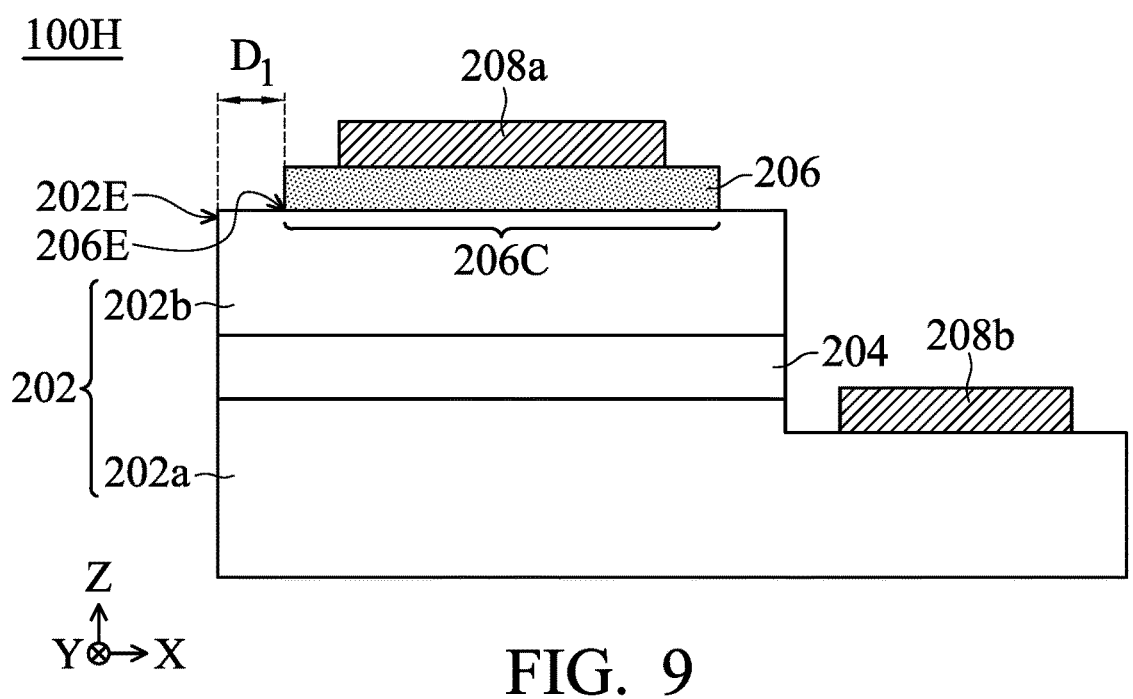
FIG. 9 illustrates a cross-sectional diagram of the light-emitting unit in accordance with some embodiments of the present disclosure.

Next, refer to FIG. 9, which illustrates a cross-sectional diagram of a light-emitting unit 100H in accordance with some other embodiments of the present disclosure. In this embodiment, the light-emitting unit 100H is a flip-chip type light-emitting unit. As shown in FIG. 9, the light-emitting unit 100H may comprise a transporting layer 202 (a first semiconductor region 202a and a second semiconductor region 202b), a quantum well layer 204 disposed between the transporting layers 202, and a first conductive layer 206 disposed on the transporting layer 202. In addition, the light-emitting unit 100H may comprise a second conductive layer 208a disposed on the first conductive layer 206 and a third conductive layer 208b disposed on the first semiconductor region 202a. In this embodiment, the second conductive layer 208a and the third conductive layer 208b are disposed on the same side of the transporting layer 202.

Similarly, in this embodiment, the first conductive layer 206 may also have a contact region 206C that is in contact with the second semiconductor region 202b. The edge 206E of the contact region 206C is separated from the edge 202E of the transporting layer 202 by a distance $D_1$. In some embodiments, the distance $D_1$ between the edge 206E of the contact region 206C and the edge 202E of the transporting layer 202 may be greater than or equal to 0.1 µm in a direction that is perpendicular to Z direction (i.e. in the X-Y plane). In some embodiments, the distance $D_1$ may be greater than or equal to 0.5 µm.

The first conductive layer 206 shrinks inward compared with the transporting layer 202. With such a configuration, the first conductive layer 206 may direct current from the contact region 206C to the second semiconductor region 202b that is below the contact region 206C. The chance that current flows through the sidewalls of the transporting layer 202 and to be trapped by defects on the sidewalls may be reduced. Accordingly, the risk that leakage current will occur may be reduced and the luminous efficiency of the light-emitting unit 100H may be improved.

Figure 10:
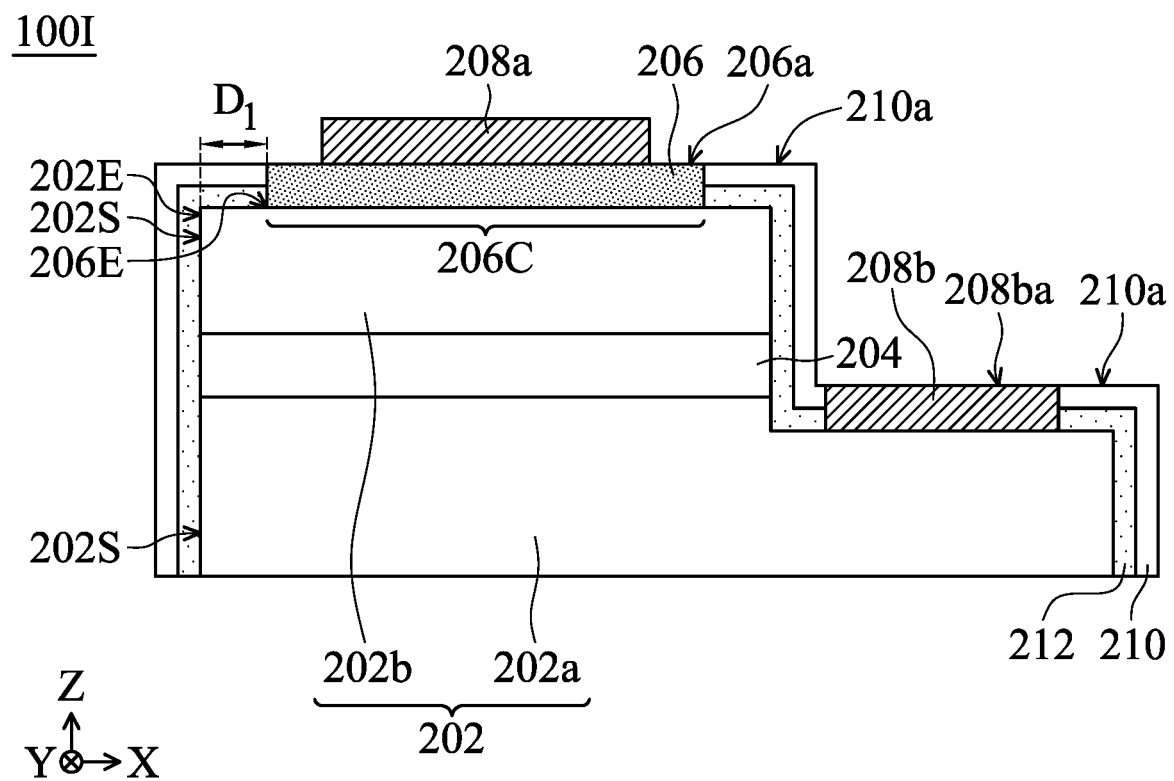
FIG. 10 illustrates a cross-sectional diagram of the light-emitting unit in accordance with some embodiments of the present disclosure.

Next, refer to FIG. 10, which illustrates a cross-sectional diagram of a light-emitting unit 100I in accordance with some other embodiments of the present disclosure. The light-emitting unit 100I shown in FIG. 10 is substantially similar to the light-emitting unit 100H shown in FIG. 9. The difference between them is that the light-emitting unit 100 further comprises a current blocking layer 212 and a reflective layer 210 that covers the current blocking layer 212, and the current blocking layer 212 covers the side surfaces 202S of the transporting layer 202. In some embodiments, the reflective layer 210 may be conformally formed over the current blocking layer 212. In some embodiments, a top surface 210a of portions of the reflective layer 210 may be substantially aligned with the top surface 206a of portions of the first conductive layer 206. In some embodiments, portions of the top surface 210a of the reflective layer 210 may be substantially aligned with a top surface 208ba of the third conductive layer 208b. In some embodiments, portions of the current blocking layer 212 may be located on the first conductive layer 206 (not illustrated). In addition, as described above, the reflective layer 210 covering the current blocking layer 212 may increase the amount of light emission at front and/or reduce the amount of light emission at the sides of the light-emitting unit 100. Therefore, crosstalk interference may be reduced and/or the luminous efficiency of the light-emitting unit 100I may be improved.

To summarize the above, in accordance with some embodiments of the present disclosure, there is a distance between the edge of the conductive layer and the edge of the transporting layer so that the chance of current flowing through the sidewall edges of the light-emitting unit may be reduced. Therefore, the risk of current leakage may be reduced, and/or the luminous efficiency of the light-emitting unit may be improved. In accordance with some embodiments of the present disclosure, the light-emitting unit of the display device may comprise the current blocking layer disposed on the side surfaces, which may increase ohmic resistance between the conductive layer and the transporting layer. The current blocking layer may also prevent the defect of the side surfaces from capturing electrons and/or causing leakage current. Such a configuration may reduce the risk of short circuit when the display device is in contact with other conductive elements during an assembling process.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to comprise within their scope such processes, machines, manufacture, compositions of matter, means, methods, or steps.

What is claimed is:

1. A display device, comprising:
    a substrate;
    a light-emitting unit disposed on the substrate, the light-emitting unit comprising:
    a transporting layer comprising a first semiconductor region and a second semiconductor region;
    a current blocking layer covering a side surface of the transporting layer; and
    a conductive layer comprising a contact region that is in contact with the second semiconductor region; and
    a reflective layer covering the current blocking layer; wherein a distance between an edge of the contact region and an edge of the transporting layer is greater than or equal to 0.1 µm, and wherein the reflective layer is formed over the current blocking layer and in contact with current blocking layer, and a bottom surface of the current blocking layer, a bottom surface of the reflective layer and a bottom surface of the transporting layer are coplanar.

2. The display device as claimed in claim 1, wherein the distance between the edge of the contact region and the edge of the transporting layer is greater than or equal to 0.5 µm.

3. The display device as claimed in claim 1, wherein the conductive layer shrinks inward compared with the transporting layer.

4. The display device as claimed in claim 1, wherein the transporting layer further comprises a high-resistance region, and the high-resistance region is in contact with the second semiconductor region.

5. The display device as claimed in claim 4, wherein the high-resistance region is electrically insulating.

6. The display device as claimed in claim 4, wherein a resistivity of the high-resistance region is more than 5 times a resistivity of the second semiconductor region.

7. The display device as claimed in claim 4, wherein a dopant concentration of the high-resistance region is lower than a dopant concentration of the second semiconductor region.

8. The display device as claimed in claim 4, wherein the light-emitting unit further comprises a quantum well layer disposed between the first semiconductor region and the second semiconductor region.

9. The display device as claimed in claim 8, wherein the high-resistance region extends from a bottom surface of the conductive layer toward the quantum well layer.

10. The display device as claimed in claim 8, wherein the high-resistance region is in contact with the quantum well layer.

11. The display device as claimed in claim 1, wherein the current blocking layer comprises silicon oxides, silicon nitrides, silicon oxynitrides, aluminum oxides, titanium dioxides, or a combination thereof.

12. The display device as claimed in claim 1, wherein the current blocking layer and the transporting layer at least partially overlap in a normal direction of the substrate.

13. The display device as claimed in claim 1, wherein the conductive layer and the current blocking layer at least partially overlap in the normal direction of the substrate.

14. The display device as claimed in claim 1, wherein the conductive layer comprises a plurality of slits.

15. The display device as claimed in claim 14, wherein the slit extends from a top surface of the conductive layer to a bottom surface of the conductive layer.

16. The display device as claimed in claim 1, wherein the light-emitting unit comprises a vertical type light-emitting unit or a flip-chip type light-emitting unit.

* * * * *